(12) United States Patent
Noteboom et al.

(10) Patent No.: US 10,212,858 B2
(45) Date of Patent: Feb. 19, 2019

(54) COLD ROW ENCAPSULATION FOR SERVER FARM COOLING SYSTEM

(75) Inventors: Scott Noteboom, San Jose, CA (US); Albert Dell Robison, Placerville, CA (US)

(73) Assignee: Excalibur IP, LLC, New York, NY (US)

( * ) Notice: Subject to any disclaimer, the term of this patent is extended or adjusted under 35 U.S.C. 154(b) by 706 days.

(21) Appl. No.: 12/427,666

(22) Filed: Apr. 21, 2009

(65) Prior Publication Data

US 2010/0263830 A1 Oct. 21, 2010

(51) Int. Cl.
| | |
|---|---|
| F28F 7/00 | (2006.01) |
| H01L 23/467 | (2006.01) |
| H05K 7/20 | (2006.01) |

(52) U.S. Cl.
CPC ....... *H05K 7/2079* (2013.01); *H05K 7/20745* (2013.01)

(58) Field of Classification Search
CPC ............. H05K 7/2079; H05K 7/20745; H05K 7/20836; H05K 7/1497
USPC ..... 165/80.2, 104.19, 104.33, 121; 361/695; 454/186
See application file for complete search history.

(56) References Cited

U.S. PATENT DOCUMENTS

| | | | |
|---|---|---|---|
| 5,501,754 A | 3/1996 | Hiraguri | |
| 5,653,070 A | 8/1997 | Seguin | |
| 5,671,805 A | 9/1997 | Stånghl et al. | |
| 5,682,712 A | 11/1997 | Kemeny | |
| 5,718,628 A | 2/1998 | Nakazato | |
| 6,028,766 A | 2/2000 | Strickler | |
| 6,034,873 A | 3/2000 | Stånghl et al. | |
| 6,131,647 A | 10/2000 | Suzuki et al. | |
| 6,272,955 B1 | 8/2001 | Scemama | |
| 6,305,180 B1 | 10/2001 | Miller et al. | |
| 6,374,627 B1 | 4/2002 | Schumacher | |
| 6,494,050 B2 | 12/2002 | Spinazzola et al. | |
| 6,525,935 B2 | 2/2003 | Casebolt | |
| 6,557,357 B2 | 5/2003 | Spinazzola | |
| 6,574,970 B2 | 6/2003 | Spinazzola | |

(Continued)

FOREIGN PATENT DOCUMENTS

| | | |
|---|---|---|
| DE | 709149 | 8/1941 |
| EP | 0219474 A1 | 4/1987 |

(Continued)

OTHER PUBLICATIONS

Jp 2002156136 A translation Jun. 3, 2014.*

(Continued)

*Primary Examiner* — Jon T Schermerhorn, Jr.
(74) *Attorney, Agent, or Firm* — Martine Penilla Group, LLP (57) ABSTRACT

Apparatuses, methods, and systems directed to efficient cooling of data centers. Some embodiments of the invention allow encapsulation of cold rows through an enclosure and allow server fans to draw cold air from the cold row encapsulation structure to cool servers installed on the server racks. In other particular embodiments, the systems disclosed can be used to mix outside cool air into the cold row encapsulation structure to cool the servers. In some embodiments, the present invention involves utilizing a raised sub-floor design of a data center room.

10 Claims, 3 Drawing Sheets

(56) References Cited

U.S. PATENT DOCUMENTS

| | | | |
|---|---|---|---|
| 6,651,452 B2 | 11/2003 | Lecke et al. | |
| 6,672,955 B2 | 1/2004 | Charron | |
| 6,722,151 B2 | 4/2004 | Spinazolla et al. | |
| 6,745,579 B2 | 6/2004 | Spinazzola | |
| 6,822,859 B2 | 11/2004 | Coglitore et al. | |
| 6,854,287 B2 | 2/2005 | Patel | |
| 6,859,366 B2 | 2/2005 | Fink | |
| 6,867,967 B2 | 3/2005 | Mok | |
| 6,886,353 B2 | 5/2005 | Patel | |
| 6,980,433 B2 | 12/2005 | Fink | |
| 7,003,971 B2 | 2/2006 | Kester et al. | |
| 7,046,514 B2 | 5/2006 | Fink et al. | |
| 7,065,933 B2 | 6/2006 | Chandler | |
| 7,085,133 B2 | 8/2006 | Hall | |
| 7,145,772 B2 | 12/2006 | Fink | |
| 7,165,412 B1 | 1/2007 | Bean, Jr. | |
| 7,173,820 B2 | 2/2007 | Fink | |
| 7,259,963 B2 | 8/2007 | Germagian et al. | |
| 7,266,964 B2 | 9/2007 | Vogel et al. | |
| 7,278,273 B1 | 10/2007 | Whitted et al. | |
| 7,325,410 B1 | 2/2008 | Bean, Jr. | |
| 7,372,695 B2 | 5/2008 | Coglitore et al. | |
| 7,403,391 B2 | 7/2008 | Germagian | |
| 7,430,118 B1* | 9/2008 | Noteboom et al. | 361/695 |
| 7,499,273 B2 | 3/2009 | Casebolt | |
| 7,529,086 B2 | 5/2009 | Fink | |
| 7,534,167 B2 | 5/2009 | Day | |
| 7,542,287 B2 | 6/2009 | Lewis et al. | |
| 7,684,193 B2 | 3/2010 | Fink | |
| 7,688,578 B2 | 3/2010 | Mann et al. | |
| 7,800,900 B1 | 9/2010 | Noteboom et al. | |
| 7,903,407 B2 | 3/2011 | Matsushima et al. | |
| 7,916,470 B2 | 3/2011 | Mills et al. | |
| 7,971,446 B2 | 7/2011 | Cidaras et al. | |
| 8,054,625 B2 | 11/2011 | Noteboom et al. | |
| 8,072,780 B1 | 12/2011 | Roy | |
| 8,174,829 B1 | 5/2012 | Rotheroe | |
| 8,498,114 B2 | 7/2013 | Martini | |
| 2002/0126449 A1 | 9/2002 | Casebolt | |
| 2002/0172013 A1 | 11/2002 | Chandler | |
| 2003/0178253 A1 | 9/2003 | Tatge | |
| 2003/0230700 A1 | 12/2003 | Kemeny | |
| 2004/0089009 A1* | 5/2004 | Bash et al. | 62/259.2 |
| 2004/0184232 A1 | 9/2004 | Fing | |
| 2004/0221604 A1 | 11/2004 | Ota et al. | |
| 2004/0252464 A1 | 12/2004 | Dobbs et al. | |
| 2004/0262487 A1 | 12/2004 | Kawashima et al. | |
| 2004/0264131 A1 | 12/2004 | Nishiyama et al. | |
| 2005/0168945 A1 | 8/2005 | Coglitore | |
| 2005/0182523 A1 | 8/2005 | Nair | |
| 2006/0139877 A1 | 6/2006 | Germagian | |
| 2006/0260338 A1 | 11/2006 | VanGilder et al. | |
| 2007/0019380 A1 | 1/2007 | Campbell et al. | |
| 2007/0133168 A1 | 6/2007 | Shabany | |
| 2007/0135032 A1 | 6/2007 | Wang | |
| 2007/0135033 A1* | 6/2007 | Kao et al. | 454/184 |
| 2007/0146994 A1 | 6/2007 | Germagian et al. | |
| 2007/0171613 A1 | 7/2007 | McMahan et al. | |
| 2007/0281639 A1 | 12/2007 | Cidaras et al. | |
| 2007/0283710 A1 | 12/2007 | Gilbert et al. | |
| 2008/0055846 A1 | 3/2008 | Cidaras et al. | |
| 2008/0055850 A1 | 3/2008 | Carlson et al. | |
| 2008/0094797 A1 | 4/2008 | Coglitore et al. | |
| 2008/0185446 A1 | 8/2008 | Tozer | |
| 2008/0291626 A1 | 11/2008 | Nelson et al. | |
| 2008/0305733 A1 | 12/2008 | Noteboom et al. | |
| 2009/0014397 A1 | 1/2009 | Moss et al. | |
| 2009/0021907 A1 | 1/2009 | Mann | |
| 2009/0046427 A1 | 2/2009 | Noteboom et al. | |
| 2009/0168345 A1 | 7/2009 | Martini | |
| 2009/0210096 A1* | 8/2009 | Stack | F24F 11/30 700/278 |
| 2009/0229194 A1 | 9/2009 | Armillas | |
| 2009/0241578 A1 | 10/2009 | Carlson et al. | |
| 2009/0255653 A1 | 10/2009 | Mills et al. | |
| 2010/0048119 A1 | 2/2010 | Tashiro | |
| 2010/0064714 A1 | 3/2010 | Tashiro | |
| 2010/0091448 A1 | 4/2010 | Noteboom | |
| 2010/0144265 A1 | 6/2010 | Bednarcik et al. | |
| 2010/0188816 A1 | 7/2010 | Bean et al. | |
| 2010/0263830 A1 | 10/2010 | Noteboom et al. | |
| 2010/0278080 A1 | 11/2010 | Pan et al. | |
| 2011/0154842 A1 | 6/2011 | Heydari et al. | |
| 2011/0156480 A1 | 6/2011 | Park | |
| 2011/0161602 A1 | 6/2011 | Adams et al. | |
| 2011/0161980 A1 | 6/2011 | English et al. | |
| 2011/0161987 A1 | 6/2011 | Huang et al. | |
| 2011/0317357 A1 | 12/2011 | Sato et al. | |

FOREIGN PATENT DOCUMENTS

| | | |
|---|---|---|
| EP | 1 903 849 A1 | 3/2008 |
| EP | 1903849 A1 | 3/2008 |
| GB | 1214388 A | 12/1970 |
| GB | 2444981 A | 6/2008 |
| JP | H10-185105 A | 7/1998 |
| JP | H10-249840 A | 9/1998 |
| JP | H11-082616 | 3/1999 |
| JP | H11-253247 A | 9/1999 |
| JP | 2000-010662 A | 1/2000 |
| JP | 2001-272086 A | 10/2001 |
| JP | 2002-061911 A | 2/2002 |
| JP | 2002-156136 A | 5/2002 |
| JP | 2002156136 A * | 5/2002 |
| JP | 2002-237690 A | 8/2002 |
| JP | 2003-109118 | 4/2003 |
| JP | 2003-166729 | 6/2003 |
| JP | 2003-166729 A | 6/2003 |
| JP | 2003-221924 A | 8/2003 |
| JP | 2004-184070 A | 7/2004 |
| JP | 2004-319628 | 11/2004 |
| JP | 2004-319628 A | 11/2004 |
| JP | 2006-064303 A | 3/2006 |
| JP | 2006-081579 A | 3/2006 |
| JP | 2007-316989 A | 6/2007 |
| TW | 444886 | 7/2001 |
| TW | M251439 | 11/2004 |
| TW | M307141 | 4/2006 |
| TW | 200831833 | 8/2008 |
| TW | 200831833 A | 8/2008 |
| TW | M351368 | 2/2009 |
| WO | WO 199608183 | 3/1996 |
| WO | WO 2002016854 | 2/2002 |
| WO | WO 2004083743 | 9/2004 |
| WO | WO 2007098068 A2 | 8/2007 |
| WO | WO 2008127344 A1 * | 10/2008 |
| WO | WO 2008150566 A1 | 12/2008 |

OTHER PUBLICATIONS

PCT/US2008/058504, Notification of Transmittal of the International Search Report and the Written Opinion of the International Searching Authority, or the Declaration, dated Sep. 23, 2008, 10 pages.

Xhigemi, "Patent Abstracts of Japan," Publication No. 2004-319628, Published Nov. 11, 2004, 1 page.

Masanori et al., "Patent Abstracts of Japan," Publication No. 2003-166729, Published Jun. 13, 2003, 1 page.

Noteboom et al., "Cold Row Encapsulation for Server Farm Cooling System," U.S. Appl. No. 11/757,864, 29 pages, filed Jun. 4, 2007.

Noteboom et al., "Cold Row Encapsulation for Server Farm Cooling System," U.S. Appl. No. 12/193,113, 25 pages, filed Aug. 18, 2008.

Noteboom et al., "Cold Row Encapsulation for Server Farm Cooling System," U.S. Appl. No. 12/258,683, 27 pages, filed Oct. 27, 2008.

Noteboom et al., "Cold Row Encapsulation for Server Farm Cooling System," U.S. Appl. No. 12/427,655, 27 pages, filed Apr. 21, 2009.

(56) References Cited

OTHER PUBLICATIONS

Noteboom et al., "Cold Row Encapsulation for Server Farm Cooling System," U.S. Appl. No. 12/427,666, 23 pages, filed Apr. 21, 2009.
Noteboom et al., "Cold Row Encapsulation for Server Farm Cooling System," U.S. Appl. No. 12/427,660, 20 pages, filed Apr. 21, 2009.
Office Action for U.S. Appl. No. 12/258,683 dated Aug. 5, 2009.
Noteboom et al., "Integrated Building Based Air Handler for Server Farm Cooling System," U.S. Appl. No. 12/500,520, filed Jul. 9, 2009.
Written Opinion for Austrian Patent Application No. 200905275-4 dated Mar. 19, 2010.
Canadian Intellectual Property Office Report on Application No. 2,679,469 (dated Jun. 6, 2011).
Noteboom et al., U.S. Appl. No. 12/635,966, filed Dec. 11, 2009.

\* cited by examiner

COLD ROW ENCAPSULATION FOR SERVER FARM COOLING SYSTEM

TECHNICAL FIELD

The present disclosure relates generally to cooling systems for data centers.

BACKGROUND

The rapid growth of Internet services such as Web email, Web search, Web site hosting, and Web video sharing is creating increasingly high demand for computing and storage power from servers in data centers. While the performance of servers is improving, the power consumption of servers is also rising despite efforts in low power design of integrated circuits. For example, one of the most widely used server processors, AMD's Opteron processor, runs at up to 95 watts. Intel's Xeon server processor runs at between 110 and 165 watts. Processors are only part of a server, however; other parts in a server such as cooling fans and storage devices consume additional power.

Servers are typically placed in racks in a data center. There are a variety of physical configurations for racks. A typical rack configuration includes mounting rails to which multiple units of equipment, such as server blades, are mounted and stacked vertically within the rack. One of the most widely used 19-inch rack is a standardized system for mounting equipment such as 1 U or 2 U servers. One rack unit on this type of rack typically is 1.75 inches high and 19 inches wide. A server that can be installed in one rack unit is commonly designated as a 1 U server. In data centers, a standard rack is usually densely populated with servers, storage devices, switches, and/or telecommunications equipment.

A data center room should be maintained at acceptable temperatures and humidity for reliable operation of the servers, which typically have cooling fans that draw air through the chassis for cooling. The power consumption of a rack densely stacked with servers powered by Opteron or Xeon processors may be between 7,000 and 15,000 watts. As a result, server racks can produce very concentrated heat loads. The heat dissipated by the servers in the racks is exhausted to the data center room. The heat collectively generated by densely populated racks can have an adverse effect on the performance and reliability of the equipment in the racks, since they rely on the surrounding air for cooling. Accordingly, heating, ventilation, air conditioning (HAVC) systems are often an important part of the design of an efficient data center.

A typical data center consumes 10 to 40 megawatts of power. The majority of energy consumption is divided between the operation of servers and HVAC systems. HVAC systems have been estimated to account for between 25 to 40 percent of power use in data centers. For a data center that consumes 40 megawatts of power, the HAVC systems may consume 10 to 16 megawatts of power. Significant cost savings can be achieved by utilizing efficient cooling systems and methods that reduce energy use. For example, reducing the power consumption of HVAC systems from 25 percent to 10 percent of power used in data centers translates to a saving of 6 megawatts of power which is enough to power thousands of residential homes.

In a data center room, server racks are typically laid out in rows with alternating cold and hot aisles between them. All servers are installed into the racks to achieve a front-to-back airflow pattern that draws conditioned air in from the cold rows, located in front of the rack, and ejects heat out through the hot rows behind the racks. A raised floor room design is commonly used to accommodate an underfloor air distribution system, where cooled air is supplied through vents in the raised floor along the cold aisles.

An important factor in efficient cooling of data center is to manage the air flow and circulation inside a data center. Computer Room Air Conditioners (CRAC) units supply cold air through floor tiles including vents between the racks. In addition to servers, CRAC units consume significant amounts of power as well. One CRAC unit may have up to three 5 horsepower motors and up to 150 CRAC units may be needed to cool a data center. The CRAC units collectively consume significant amounts of power in a data center. For example, in a data center room with hot and cold row configuration, hot air from the hot rows is moved out of the hot row and circulated to the CRAC units. The CRAC units cool the air. Fans powered by the motors of the CRAC units supply the cooled air to an underfloor plenum defined by the raised sub-floor. The pressure created by driving the cooled air into the underfloor plenum drives the cooled air upwardly through vents in the subfloor, supplying it to the cold aisles where the server racks are facing. To achieve a sufficient air flow rate, hundreds of powerful CRAC units may be installed throughout a typical data center room. However, since CRAC units are generally installed at the corners of the data center room, their ability to efficiently increase air flow rate is negatively impacted.

SUMMARY

The present invention provides systems and methods directed to efficient cooling of data centers where a raised sub-floor design is used. In a particular embodiment, the present invention provides a cold row encapsulation structure comprising at least one server rack port configured to interface with one or more server racks and a cooling module connected to the top surface of the cold row encapsulation structure. The server rack ports are configured to engage the server racks such that a front face of the server racks interface with the interior space defined by the cold row encapsulation structure. In some embodiments, server racks ports and server racks are tightly connected by clamps and/or sealing gaskets to reduce air leakage into and out of the cold row encapsulation structure. The cold row encapsulation structure resides on a raised sub-floor to allow for a variety of air flow paths and air handling mechanisms.

Some embodiments of the invention utilize cooling fans of the servers installed on the racks to draw cold air from cold row encapsulation structure from the front face of the server racks and to eject hot air from the back side of the server racks. The cooling module installed on top of the cold row encapsulation structure cools the hot air through cooling coils installed inside the cooling module. In some embodiments, cold water is used inside the coils to exchange heat with hot air in the cooling module.

In one embodiment of the present invention, the systems and methods are directed to cooling hot air inside the data center server cooling room without introducing outside air. The hot air ejected by the server fans may be partially cooled by one or more fan units or may simply be recirculated to the room. The hot air or the partially cooled hot air enters the cooling modules that may be located on top of the cold row encapsulation structure. The hot air or partially cooled hot air is cooled by the water based cooling coils inside the cooling modules and the cooled air enters the cold row encapsulation structure through gravity and the lower pressure created inside the interior space of the cold row encapsulation structure. Server fans draw cold air from the server rack ports connected to the cold row encapsulation structure to cool the servers and eject hot air from the back side of the server racks.

In other embodiments of the present invention, the systems and methods involve mixing outside cool air to cool the servers. In one embodiment, ceiling dampers in a data center may be controlled by a temperature control unit and opened up when the outside temperature reaches certain threshold value. Outside air enters the data center and passes through the cooling module installed on top of the cold row encapsulation structure. Server fans draw the cold air from the cold row encapsulation structure. Hot air is exhausted to the outside by the ceiling exhaust fans. In some embodiments, to control the moisture in the air in the data center server cooling room, especially when the outside air fails to meet the operating requirements for the servers and other equipment, humidifiers may be used to condition the outside air. In recent years, however, manufacturers of server equipment have significantly relaxed the humidity requirements due to technological advancement.

The following detailed description together with the accompanying drawings will provide a better understanding of the nature and advantages of various embodiments of the present invention.

DESCRIPTION OF EXAMPLE EMBODIMENT(S)

The following example embodiments and their aspects are described and illustrated in conjunction with apparatuses, methods, and systems which are meant to be illustrative examples, not limiting in scope.

Figure 1:
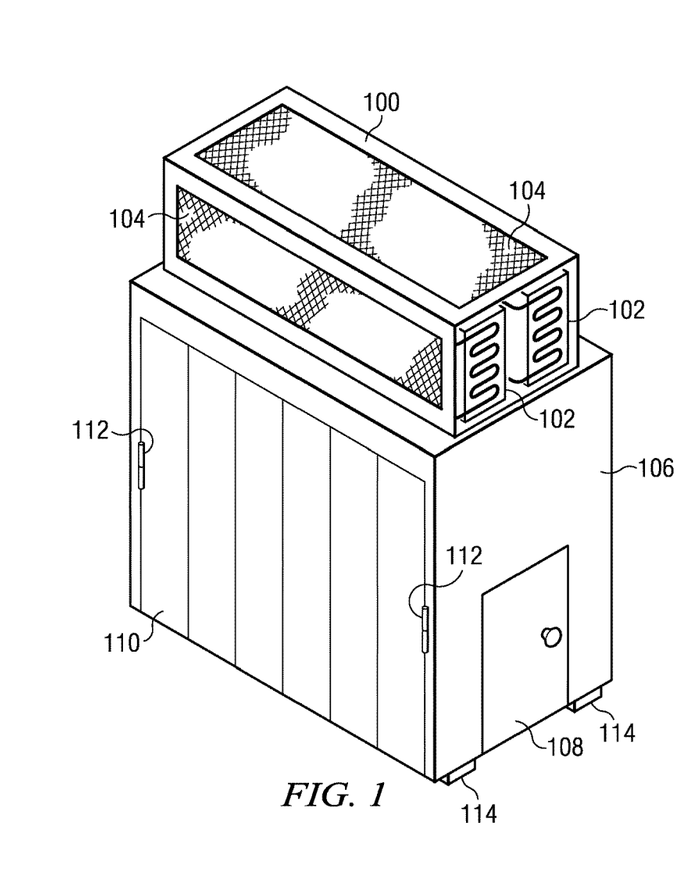
FIG. 1 is a diagram showing an example cold row encapsulation structure and an example cooling module.

FIG. 1 illustrates an example cooling module 100 and an example cold row encapsulation structure 106. The cold row encapsulation structure 106 may have a frame, panels, doors, and server rack ports. A server rack port is an opening on the cold row encapsulation structure 106 that can be connected to a server rack. The cold row encapsulation structure 106 may be made of a variety of materials such as steel, composite materials, or carbon materials that create a housing defining an interior space including at least one server rack port that allows rack mounted unit to interface with the interior space.

The cooling module 100 may be located and positioned on top of the cold row encapsulation structure 106 and connected to the top surface of the cold row encapsulation structure 106. The cooling module 100 comprises one or more cooling coils 102. Liquid passing inside the cooling coils 102 is used to exchange heat with relatively hot air passing through the cooling module 100, thereby cooling the air. In one embodiment, the cooling module 100 further comprises an enclosure inside which the cooling coils 102 are located. The cooling module enclosure may have one or more openings 104 through which air enter the enclosure. In some embodiments, the openings 104 may comprise air filters. The cooling module enclosure may have one or more openings connected to the top surface of the cold row encapsulation structure 106, through which openings cold air exits the cooling module and enters the interior space defined by the cold row encapsulation structure.

In some embodiments, water is used inside the cooling coils 102 as heat exchangers. Water pumps, water cooling equipment, and associated plumbing (not illustrated) supplies cooled water to the cooling coils 102. In other embodiments, other types of liquid such as a water-glycol solution, steam, or a refrigerant may be used inside the cooling coils 102 as heat exchangers.

In some embodiments, the cooling coils 102 may be serpentine shaped lines of tubing. In other embodiments, the cooling coils 102 may be in other shapes such as straight lines of tubing. Depending on the size of the cold row encapsulation structure 106, the cooling requirements, the velocity of air flow, and the physical characteristics of the cooling coils 102, the number of cooling coils in the cooling module 100 may vary. In one embodiment, two cooling coils are used inside the cooling module 100.

Since cold air is generally heavier than hot air, the cold air cooled by the cooling coils 102 generally moves downward into the interior space defined by the cold row encapsulation structure 106 which may be located below and connected to the cooling module 100. The cold row encapsulation structure 106 comprises an enclosure which defines an interior space. The enclosure comprises at least one server rack port 110 configured to interface with a plurality of server racks. The server rack port 110 is configured to interface with the server racks such that a front face of the server racks intersects the interior space of the cold row encapsulation structure 106. In one embodiment, six standard server racks may be connected to the server rack port 110. In another embodiment, twelve standard server racks may be connected to the server rack port 110. In some embodiments, the server racks and the server rack ports 110 may be connected together through one or more clamps 112. In other embodiments, the server racks and the server rack ports 110 may be placed next to each other. In some other embodiments, sealing materials such as gaskets may be used to tightly connect the server rack port 110 and the server racks. The servers are installed into the racks to achieve a front-to-back airflow pattern that draws conditioned air in from the cold row encapsulation structure 106 in the front, and ejects heat out behind the racks.

Figure 4:
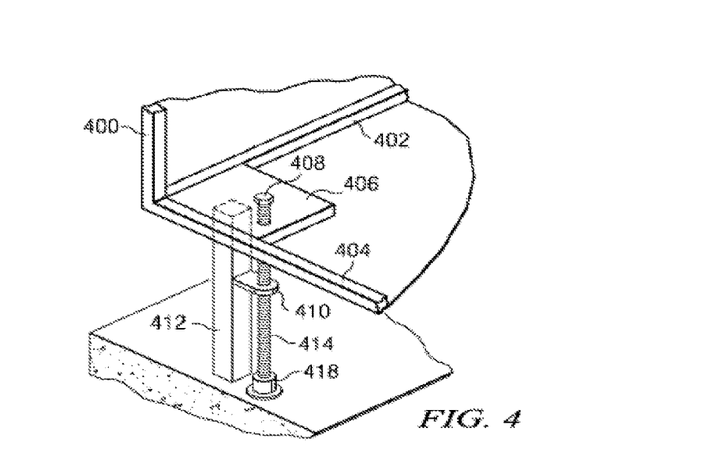
FIG. 4 is a diagram showing an example support beam in the raised sub-floor that is fastened with a metal plate on the bottom of a cold row encapsulation structure.

In one embodiment, the cold row encapsulation structure 106 may comprise more than one server rack port 110. A server rack port 110 may engage a server rack such that the front face of servers or other devices installed in the server interface with the interior space defined by the cold row encapsulation structure 106. This configuration achieves a front-to-back airflow pattern, where the cooling fans of the servers or other rack-mounted units draw air from the interior space and exhaust air heated by the processor(s) and other components out the back panel, as illustrated in FIG. 4. In some embodiments, the server rack and the cold row encapsulation structure may be substantially sealed; conditioned cold air inside the interior space of the cold row encapsulation structure 106 is drawn by the server fans inside the servers to cool the servers. In other embodiments, the server rack and the cold row encapsulation structure 106 are placed next to each other so that conditioned cold air inside the interior space of the cold row encapsulation structure 106 can be drawn to the servers by the server fans inside the servers. The relatively hot air is circulated to the cooling module 100 on top of the cold row encapsulation structure 106 and exchanges heat with the cooling coils 102. Cold air from the cooling module 100 sinks to the cold row encapsulation structure 106 and is drawn to the back of the servers by server fans inside the servers. In some embodiments, server racks are sparsely populated with servers and other equipment. Since servers and other equipment are stacked vertically within the rack, the scarcity may create open gaps to the interior space of the cold row encapsulation structure. Cold air may leak from the interior space of the cold row encapsulation structure 106, and hot air may circulate back to the interior space, thereby reducing the cooling efficiency. To prevent air leakage, the gaps may be blocked by panels mounted to the server rack that prevent air from escaping and entering the cold row encapsulation structure through the gaps.

In one embodiment, the cold row encapsulation structure 106 may further comprise stability control units 114 on the bottom. The stability control units 114 may comprise components that are built to withstand seismic movements during natural disasters such as earthquakes. In some embodiments, a stability control unit may comprise a metal plate that can be secured with a support beam in the sub-floor as illustrated in FIG. 4. When stability control units 114 are used, the cold row encapsulation structure 106 may be raised from the ground. As a result, cold air may leak and hot air may enter from the bottom side of the cold row encapsulation structure 106. To prevent air leakage, in one embodiment, the bottom side of the cold row encapsulation structure 106 may be enclosed by a panel that seals the bottom surface, on which panel the stability control units 114 may be attached.

In one embodiment, one or more doors 108 may be installed on the enclosure of the cold row encapsulation structure 106. The door 108 may be opened and closed so that data center personnel may enter the cold row encapsulation structure for a variety of tasks such as server maintenance. The door 108 may be insulated to prevent cold air from leaking out of the cold row encapsulation structure 106.

The dimension of the cold row encapsulation structure 106 can vary considerably depending on the desired number of server racks, the cooling requirements of the servers, and the like. In one embodiment, six to twelve standard server racks may be connected to respective server rack ports 110 of the cold row encapsulation structure 106. Another six to twelve standard server racks may be connected to the server rack ports on the opposite side of the cold row encapsulation structure. The distance between the opposing server rack ports may be 4 feet. The height of the cold row encapsulation structure 106 may be 12 feet and the depth may also be 12 feet.

Figure 2:
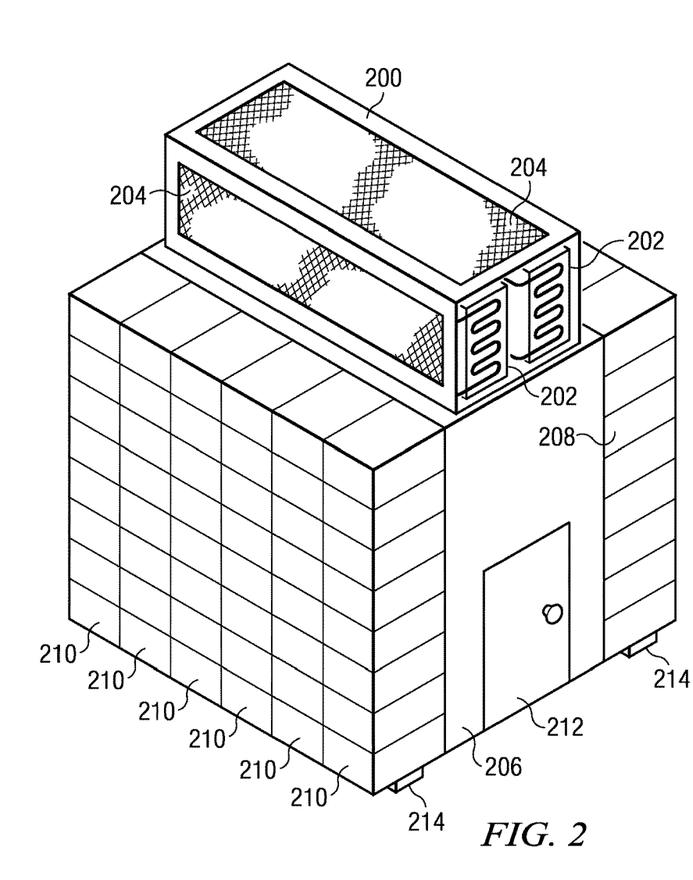
FIG. 2 is a diagram showing an example cold row encapsulation structure with integrated server racks and an example cooling module.

FIG. 2 illustrates an example cooling module 200, a cold row encapsulation structure 206, and integrated server racks 208 and 210. The system in this example is similar to the one shown in FIG. 1 except that the server racks are integral parts of the system. In this embodiment, the connection and sealing between the cold row encapsulation structure 206 and the server racks 208 and 210 are no longer required since the server racks are part of the cold row encapsulation structure 206. The servers may be installed into the integrated server racks 208 and 210 to achieve a front-to-back airflow pattern. The front face of the integrated server racks 208 and 210 intersects the interior space of the cold row encapsulation structure 206. The server fans inside the servers draw cold air from the cold row encapsulation structure 206 to cool the servers and blow out relatively hot air from the back of the server racks. Hot air is then circulated to the cooling module 200 through one or more openings 204 and exchanges heat with the one or more cooling coils 202. The cooling module 200 may be located on top of the cold row encapsulation structure 206 and may be connected to the top surface of the cold row encapsulation structure 206 through an opening on the top side of the cold row encapsulation structure 206 and the bottom side the cooling module 200. Cold air generally moves downwards, especially when server fans are drawing cold air from the cold row encapsulation structure creating lower air pressure in the interior space of the cold row encapsulation structure 206.

Figure 3:
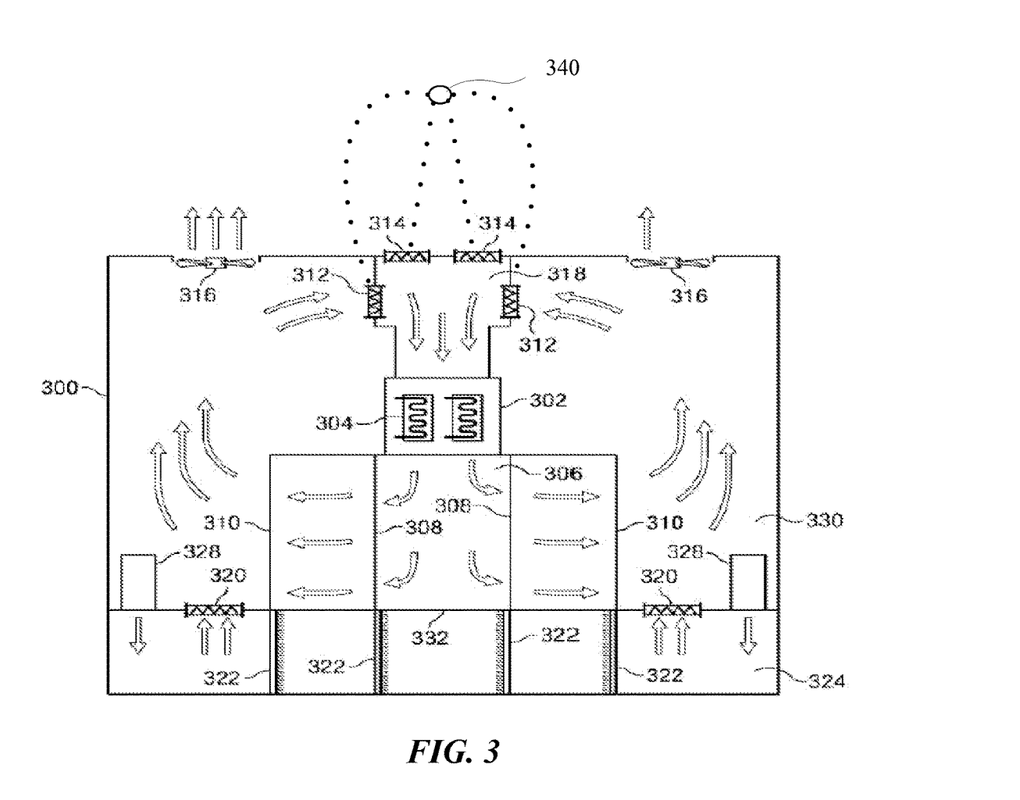
FIG. 3 is a diagram showing an example data center server cooling room with a cold row encapsulation structure, a cooling module, exhaust fans on the roof, a mixing chamber with dampers that controls the indoor and outdoor air circulation, and a raised sub-floor with one or more support beams.

The cooling systems illustrated in FIGS. 1 and 2 can operate in an interior space defined by a data center server cooling room, as disclosed above, to draw air from the interior space, and provide cooled air to the interior of the cold row encapsulation structure 106. In some implementations, however, the cooling systems may also operate in connection with a data center cooling room that includes air flow controls that allow outside air to be used. FIG. 3 illustrates an example data center server cooling room 300 with one or more ceiling exhaust fans 316, ceiling dampers 314 which controls outside air intake, a mixing chamber 318, dampers 312 that control circulation of air entering into the mixing chamber 318, and a raised sub-floor 332. One or more support beams 322 hold the raised sub-floor 332. One or more vents 320 are on the raised sub-floor so that air can be exchanged between the inside space 330 and the sub-floor space 324. In some embodiments, one or more fan units 328 may operatively cause air to flow from the sub-floor space 324 to the inside space 330. In some embodiments, a fan unit may be a CRAC unit comprising one or more fans. The CRAC units may be located at the corners of a data center room. The CRAC units can supply air through floor tiles including vents 320. For example, hot air from the hot rows is moved out of the hot row and circulated to the CRAC units. The CRAC units may cool the air partially or simply recirculate the air back to the inside space where the cooling module 302 operates to further condition the air and supply it to the cold row encapsulation structure 306, which is an enclosure. Fans powered by the motors of the CRAC units supply the air to an underfloor plenum defined by the raised sub-floor. The pressure created by forcing the air into the underfloor plenum drives the air upwardly through vents in the subfloor, supplying it to the inside space of the server cooling room 300.

The cooling module 302 comprises one or more cooling coils 304 and is connected to the mixing chamber 318. The top surface of the cold row encapsulation structure 306 is connected to the cooling module 302. Server rack ports 308 on the enclosure of the cold row encapsulation structure 306 are connected to the server racks 310. The servers may be installed into the server racks to achieve a front-to-back airflow pattern. The front face of the server racks intersects the interior space of the cold row encapsulation structure 306. The server fans inside the servers draw cold air from the cold row encapsulation structure 306 to cool the servers and eject hot air from the server racks.

The server cooling room 300 may be operated in a variety of modes. In one mode, no outside air is introduced to the server cooling room 300. The fan units 328 may partially cool the hot air ejected from the servers partially and circulate the partially cooled hot air back to the inside space. The partially cooled hot air is circulated back to the mixing chamber 318 and the cooling module 302. In another mode, no outside air is introduced to the server cooling room 300. The fan units 328 simply recirculate the hot air ejected from the servers back to the inside space. The hot air is circulated back to the mixing chamber 318 and the cooling module 302. In another mode, outside cool air is introduced to the server cooling room 300. The ceiling dampers 314 are open while the dampers 312 on the mixing chamber are closed. Outside cool air passes through the cooling module 302 and enters cold row encapsulation structure 306.

In one embodiment, the ceiling dampers 314 are closed and the dampers 312 on the mixing chamber are open. Part of the hot air ejected by the servers is exhausted outside of the server cooling room 300 through the one or more ceiling exhaust fans 316; part of the hot air enters the mixing chamber 318 through the open dampers 312. The hot air inside the mixing chamber is drawn to the cooling module 302 and exchanges heat with the cooling coils 304. Cold air then enters the cold row encapsulation structure 306 through gravity and lower air pressure inside the interior space of the cold row encapsulation structure 306.

In another embodiment, the ceiling dampers 314 are open and the dampers 312 on the mixing chamber are closed. The outside cool air enters the mixing chamber 318 through the open dampers 314, passes through the cooling module 304, and sinks to the interior space of the cold row encapsulation structure 306.

In some embodiments, the opening and closing of the dampers 312 and 314 may be controlled by a temperature control unit 340. When the outside temperature reaches an appropriate level, the temperature control unit 340 opens up the ceiling dampers 314 to allow outside air to enter the room and closes the dampers 312 on the mixing chamber to prevent hot air ejected from the server from entering the mixing chamber. When the outside temperature is too hot for the server cooling room 300, the temperature control unit 340 closes the ceiling dampers 314 to prevent introducing hot outside air indoors, and opens up the dampers 312 to allow hot air ejected from the servers back to the mixing chamber. Utilizing outside natural cool air significantly reduces energy consumption of data centers, as it reduces the need to cool the liquid circulating through the cooling module 100. In some embodiments, the opening and closing of the dampers 312 and 314, and the operation of the ceiling exhaust fans 316 are all controlled by an electronic device such as a temperature control unit 340 that monitors the temperature inside and outside the server cooling room and operates the dampers and the fans to achieve optimal efficiency in cooling the room.

Depending on the location of the data center, humidity of the outside cool air may vary. When the humidity of the outside cool air is low, the outside air may have to be conditioned so that the humidity level meets the requirement for reliable operation of the servers. Although server manufacturers have significantly relaxed the requirement on humidity for reliable operation of the server equipment, the appropriate humidity of ambient air inside a data center server cooling room still is important to the performance and reliability of the equipment in a data center. In some embodiments, one or more humidifiers may be installed in the mixing chamber 318 to condition the humidity of the air passing through the mixing chamber.

FIG. 4 illustrates an example detail of a support beam 412 along with an all threaded metal rod 414 that is fastened with a metal plate 406 on the bottom of the cold row encapsulation structure. In some embodiments, the metal rod 414 is secured with the support beam 412 by a welded all thread coupling on the floor. In some embodiments, a bolt 408 and a clasp member 410 may be used to secure the metal plate 406 to the metal rod 414. The metal plate 406 may be located at the bottom of the cold row encapsulation structure. In some embodiments, the metal plate 406 may be part of a stability control unit of the cold row encapsulation structure. In other embodiments, the support beams of the raised sub-floor may provide resistance to seismic events such as earthquakes. The all threaded metal rod 414 may be secured to the floor by a welded all thread coupling 418. The metal rod 414 also provides resistance to seismic events such as earthquakes. By securing the cold row encapsulation structure to one or more support beams and all threaded metal rods, the system leverages the seismic protection provided by the support beams of the raised sub-floor. In some embodiments, the additional all threaded metal rods provide additional seismic protection.

Figure 5:
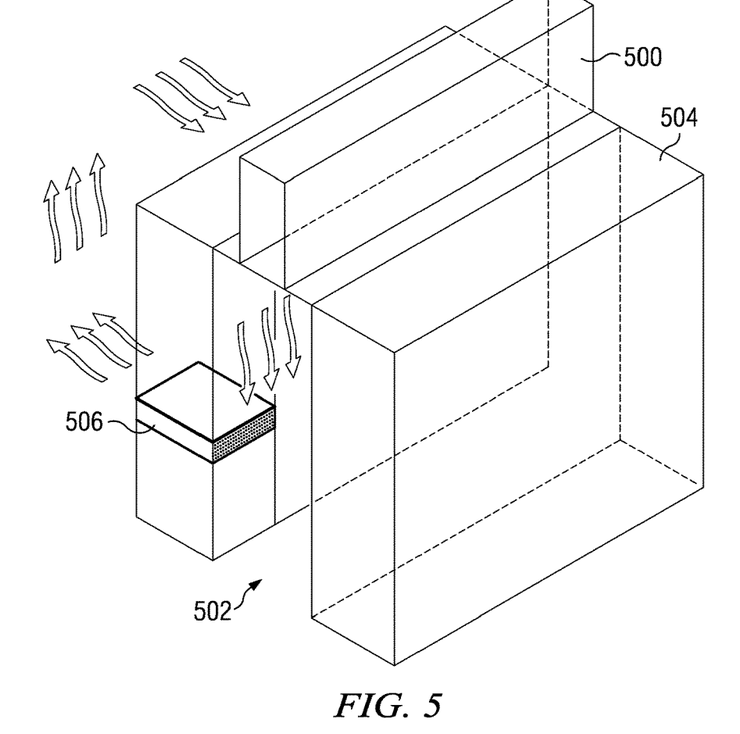
FIG. 5 is a diagram showing an example cold row encapsulation structure with integrated server racks, an example server placed on one of the server racks, and an example cooling module.

FIG. 5 illustrates an example cooling module 500, cold row encapsulation structure 502, server racks 504, and an example server 506 placed on a server rack. The system in this example is similar to the one shown in FIG. 2. Conditioned cold air enters the cold row encapsulation structure 502 through the cooling module 500 placed on top of the cold row encapsulation structure 502. Server fans inside the server 506 draw conditioned cold air from the interior space of the cold row encapsulation structure 502 and cools the server 506.

Figure 6:
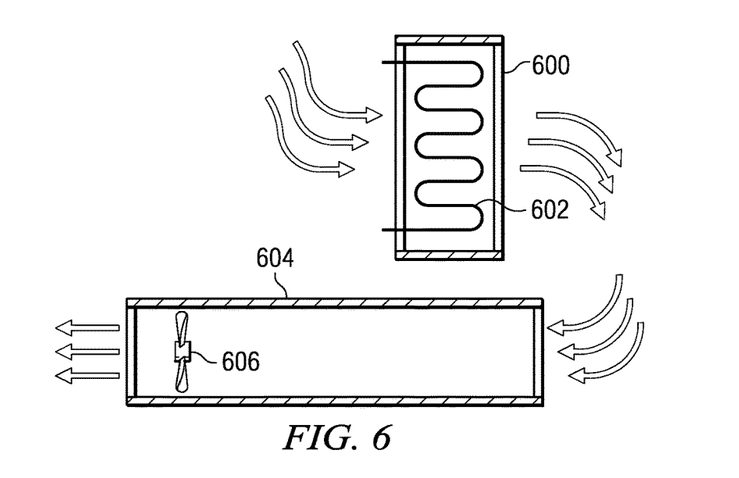
FIG. 6 is a diagram showing an example server with a server fan that draws cold air conditioned by an example cooling module.

FIG. 6 illustrates an example cooling module 600, cooling coils 602, server 604 and server fan 606 inside the server 604. Conditioned cold air from the cooling module 600 and cooling coils 602 is drawn by the server fan 606 and passes through the server 604 to cool the server. Relatively hot air is then blown out of the server 604 by the server fan 606.

The present invention has been explained with reference to specific embodiments. For example, while embodiments of the present invention have been described with reference to specific components and configurations, those skilled in the art will appreciate that different combination of components and configurations may also be used. Other embodiments will be evident to those of ordinary skill in the art. It is therefore not intended that the present invention be limited, except as indicated by the appended claims.

What is claimed is:

1. A server cooling room comprising:
   a floor;
   a plurality of lateral walls;
   a raised sub-floor disposed over the floor, wherein the floor, the lateral walls, and the raised sub-floor define a sub-floor space;
   a roof located above the raised sub-floor, wherein the raised sub-floor, the lateral walls, and the roof define an inside space, wherein the inside space is disposed over the sub-floor space, wherein the roof has a plurality of ceiling dampers;

an enclosure disposed within the inside space, wherein the enclosure defines an interior space and comprises a server rack port;

a cooling module that is located on top of and abutting the enclosure and that is operative to supply cooling air to the interior space defined by the enclosure, the cooling module comprising one or more cooling coils;

a mixing chamber connected to a top of the cooling module, the mixing chamber including a plurality of walls connected to the roof, wherein the walls of the mixing chamber have a plurality of wall dampers, wherein air is supplied to the cooling module from the mixing chamber;

a rack including one or more rack-mounted units installed therein, wherein the rack is engaged in the server rack port such that respective front faces of the one or more rack-mounted units interface with the interior space defined by the enclosure;

one or more cooling fans operative to draw air from the interior space through the respective front faces of the one or more rack-mounted units and expel air from the one or more rack-mounted units to the inside space;

a vent in the raised sub-floor, wherein the vent is located outside the enclosure;

a fan unit located in the inside space on the raised sub-floor; wherein the fan unit is located between one of the lateral walls and the vent, wherein the fan unit is configured to supply air from the inside space to the sub-floor space to drive air from the sub-floor space through the vent to the inside space;

a ceiling exhaust fan integrated within the roof and configured to exhaust air from the inside space to a space outside the server cooling room; and an electronic controller coupled to the ceiling dampers and the wall dampers and configured to monitor a temperature inside and a temperature outside the server cooling room and operate the ceiling dampers and the wall dampers to allow air from either the inside space or outside of the server cooling room into the mixing chamber.

2. The server cooling room of claim 1, wherein the raised sub-floor is supported by one or more support beams mounted on the floor.

3. The server cooling room of claim 2, wherein the enclosure is secured to the raised sub-floor.

4. The server cooling room of claim 1, wherein one of the one or more of the rack-mounted units comprises one of the one or more cooling fans.

5. The server cooling room of claim 1, wherein the mixing chamber includes one or more humidifiers that are configured to humidify air to output humidified air, wherein the cooling module is configured to cool the humidified air.

6. The server cooling room of claim 1, wherein the ceiling exhaust fan is one of a plurality of ceiling exhaust fans, wherein the ceiling exhaust fans are configured to operate to expel air from the inside space to the space outside the server cooling room.

7. The server cooling room of claim 6, wherein the electronic controller is configured to control the ceiling exhaust fans.

8. The server cooling room of claim 1, wherein the electronic controller is configured to close the ceiling dampers and open the wall dampers to allow the entry of air from the inside space into the mixing module until the temperature outside the server cooling room reaches a level.

9. The server cooling room of claim 1, further comprising:

a metal plate located at a bottom of the enclosure;

a coupling that is attached to the floor; and a threaded metal rod that is fastened to the metal plate, wherein the threaded metal rod is secured to the floor via the coupling.

10. The server cooling room of claim 9, further comprising a support beam located between the floor and the sub-floor to support the enclosure with respect to the floor, wherein the support beam is coupled to the threaded metal rod.

* * * * *